United States Patent
Park et al.

(10) Patent No.: US 9,903,562 B2
(45) Date of Patent: Feb. 27, 2018

(54) LIGHT EMITTING APPARATUS

(71) Applicant: LG Innotek Co., Ltd., Seoul (KR)

(72) Inventors: Kang Yeol Park, Seoul (KR); Chang Gyun Son, Seoul (KR); Ki Cheol Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 98 days.

(21) Appl. No.: 14/995,655

(22) Filed: Jan. 14, 2016

(65) Prior Publication Data
US 2016/0201880 A1    Jul. 14, 2016

(30) Foreign Application Priority Data
Jan. 14, 2015   (KR) ........................ 10-2015-0006518

(51) Int. Cl.
| | | |
|---|---|---|
| *F21V 13/14* | (2006.01) | |
| *F21S 8/10* | (2006.01) | |
| *H01L 33/50* | (2010.01) | |
| *F21V 9/16* | (2006.01) | |
| *F21V 7/00* | (2006.01) | |
| *F21Y 115/10* | (2016.01) | |

(52) U.S. Cl.
CPC .......... *F21V 13/14* (2013.01); *F21S 48/1145* (2013.01); *F21S 48/1154* (2013.01); *F21S 48/1159* (2013.01); *F21S 48/1317* (2013.01); *F21V 9/16* (2013.01); *H01L 33/507* (2013.01); *F21V 7/0008* (2013.01); *F21V 7/0033* (2013.01); *F21Y 2115/10* (2016.08)

(58) Field of Classification Search
CPC ............... F21S 48/1154; F21S 48/1159; F21S 48/1317; F21V 13/14

USPC ............................................................ 362/84
See application file for complete search history.

(56) References Cited

U.S. PATENT DOCUMENTS

| | | | |
|---|---|---|---|
| 2011/0085343 A1* | 4/2011 | Ohno ................... | F21S 48/1159 362/510 |
| 2012/0314442 A1 | 12/2012 | Takahashi et al. | |
| 2013/0201708 A1* | 8/2013 | Takahashi ............ | B60Q 1/0047 362/510 |

(Continued)

FOREIGN PATENT DOCUMENTS

| | | |
|---|---|---|
| EP | 2541130 A2 | 1/2013 |
| JP | 2012064597 A | 3/2012 |

(Continued)

OTHER PUBLICATIONS

Extended European Search Report dated Jun. 9, 2016 in European Application No. 16150731.4.

*Primary Examiner* — Toan Ly
(74) *Attorney, Agent, or Firm* — Saliwanchik, Lloyd & Eisenschenk

(57) ABSTRACT

Disclosed herein is a light emitting apparatus including a substrate, at least one light source, a wavelength converter disposed on the substrate to convert a wavelength of light emitted from the at least one light source, and a reflector which comprises an opening formed at a point nearest to the wavelength converter to allow the light emitted from the at least one light source to progress toward the wavelength converter, the reflector being disposed on the substrate to reflect light from the wavelength converter.

20 Claims, 8 Drawing Sheets

(56) References Cited

U.S. PATENT DOCUMENTS

2013/0314937 A1* 11/2013 Takahashi ............... F21S 48/10
  362/538
2015/0236229 A1* 8/2015 Kim ........................ H01L 33/62
  257/99

FOREIGN PATENT DOCUMENTS

| WO | WO-2008084882 A1 | 7/2008 |
| WO | WO-2014203488 A1 | 12/2014 |

* cited by examiner

LIGHT EMITTING APPARATUS

CROSS REFERENCE TO RELATED APPLICATION

This application claims the benefit under 35 U.S.C. § 119 to Korea Patent Application No. 10-2015-0006518, filed Jan. 14, 2015, which is hereby incorporated by reference in its entirety.

TECHNICAL FIELD

The embodiment relates to a light emitting apparatus.

BACKGROUND

A semiconductor light emitting diode (LED) is a type of semiconductor device which converts electricity into an infrared ray or light using properties of compound semiconductors to transmit and receive a signal or to be used as a light source.

Due to physical and chemical properties, group III-V nitride semiconductors are in the spotlight as a core material of light emitting devices such as LEDs and laser diodes (LDs).

Since LEDs or LDs do not include environmentally harmful materials such as mercury (Hg) used for existing lighting devices such as incandescent lamps and fluorescent lamps, LEDs or LDs have excellent eco-friendliness, have a long life, and consume low power, thereby replacing existing light sources.

Particularly, such light emitting devices have been expanding their application range in various fields such as headlights for vehicle and flashlights. It is necessary for light emitting apparatuses including LEDs to provide excellent light extraction efficiency and a radiant heat effect and to be reduced in size and weight.

Particularly, existing light emitting apparatuses focus or collimate excited light emitted from a light emitting device using an optical system before converting a wavelength of the excited light. Here, due to properties of the optical system, when an optical path becomes longer, a light emitting apparatus may become sensitive to a tolerance and may become mechanically complicated.

Also, when a light emitting apparatus is applied to a vehicle, it is necessary to be designed strong to withstand vibrations and the like. However, due to a complicated structure of an optical system, existing light emitting apparatuses are mechanically unstable.

BRIEF SUMMARY

The embodiment provides a light emitting apparatus having high optical conversion efficiency and a simple structure.

According to the embodiment, there is provided a light emitting apparatus including a substrate, at least one light source, a wavelength converter disposed on the substrate to convert a wavelength of light emitted from the at least one light source, and a reflector which comprises an opening formed at a point nearest to the wavelength converter to allow the light emitted from the at least one light source to progress toward the wavelength converter, the reflector being disposed on the substrate to reflect light from the wavelength converter.

The light emitting apparatus may further include a refracting member present between the reflector and the wavelength converter to fill a path through which the light passes.

A ratio of a second refractive index of the wavelength converter to a first refractive index of the refracting member may be 0.3 or less.

The light emitting apparatus may further include an optical portion disposed on a path through which the light emitted from the at least one light source progresses toward the wavelength converter.

The optical portion may include at least one focal lens disposed between the at least one light source and the wavelength converter.

The optical portion may be disposed to be inserted into the opening of the reflector.

The substrate may include a first horizontal surface, a second horizontal surface higher than the first horizontal surface, and an inclined surface disposed between the first and second horizontal surfaces, on which the wavelength converter is mounted.

An inclination angle of the inclined surface may be greater than 0° and may be 70° or less.

The opening is formed at a bottom of the reflector.

A height of the opening may be greater than 0 and may be 20 mm or less.

A focal length between the opening and the wavelength converter may be in a range from about 6 mm to about 70 mm.

The at least one light source may include a plurality of light sources, and the plurality of light sources may be disposed at the same distance from a center of the wavelength converter while being spaced apart or may be disposed at different distances from a center of the wavelength converter while being spaced apart. Also, among the plurality of light sources, the light source which has a relatively larger light amount may be disposed closer to the center than the light source which has a relatively smaller light amount.

The at least one light source may include a plurality of light sources, and the plurality of light sources may be arranged in a fan shape.

The reflector may include a passing through hole formed at a point, at which blue light reflected by the wavelength converter arrives, to allow the blue light to pass through.

The reflector may include a reflecting surface which reflects light converted in wavelength at the wavelength converter and a non-reflecting surface formed at a point at which blue light reflected by the wavelength converter arrives. The reflecting surface may be metal-mirror-coated and the non-reflecting surface may not be metal-mirror-coated. The non-reflecting surface may be surface-treated to scatter light. The non-reflecting surface may have roughness.

BRIEF DESCRIPTION OF THE DRAWINGS

Arrangements and embodiments may be described in detail with reference to the following drawings in which like reference numerals refer to like elements and wherein.

DETAILED DESCRIPTION

Hereinafter, embodiments of the present invention will be described in detail with reference to the attached drawings. However, the embodiments of the present invention may be modified in various other forms and the scope of the present invention should not be understood as being limited to the embodiments to be described below. The embodiments are provided to more completely describe the present invention to a person of ordinary skill in the art.

Throughout a description of the embodiments, it will be understood that when an element is referred to as being "formed on or under" another element, it can be directly or indirectly formed on or under the other element. That is, one or more intervening elements may be present.

Also, the terms "on" or "under" may not only mean an upward direction but also a downward direction based on one element.

Also, it will be understood that relative terms used hereafter such as "first" and "second" and "on/above/over" and "under/below/beneath" may be used only to distinguish one element from another while not always requiring or including a certain physical or logical relation or sequence between the elements.

Hereinafter, light emitting apparatuses 100A to 100D according to embodiments will be described with reference to the attached drawings as follows. For convenience, the light emitting apparatuses 100A to 100D will be described using a Cartesian coordinate system (an x axis, a y axis, and a z axis). However, it may be described using other coordinate systems. Also, the x axis, y axis, and z axis are orthogonal to one another according to the Cartesian coordinate system but the embodiments are not limited thereto. That, the x axis, y axis, and z axis may not be orthogonal to one another and may intersect one another.

Figure 1:
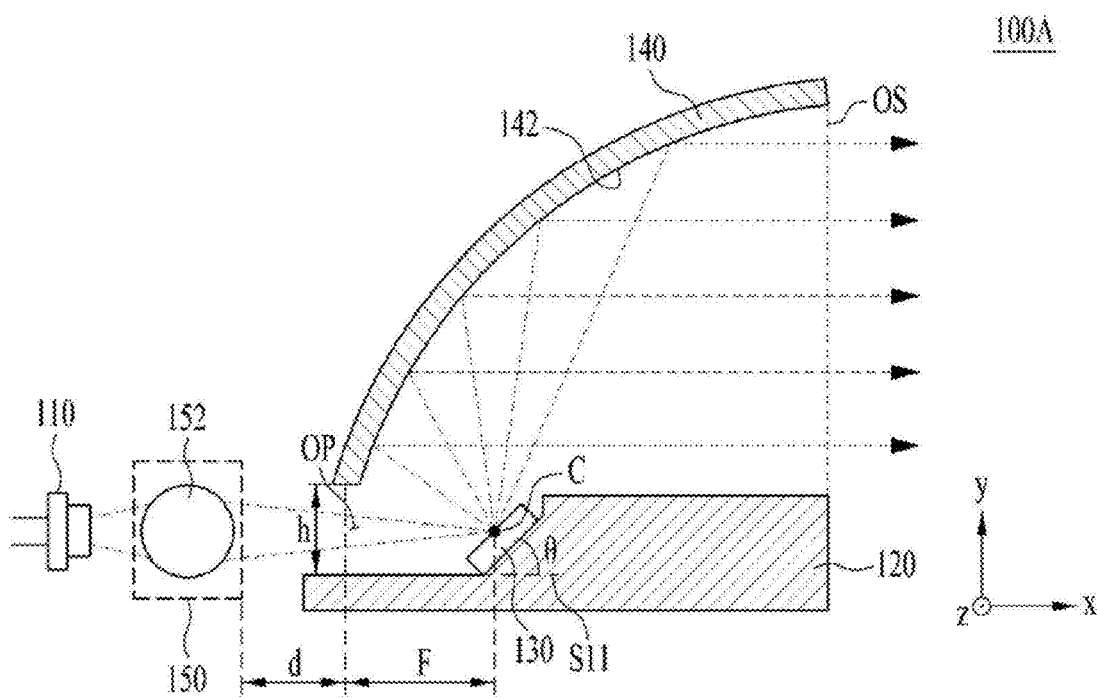
FIG. 1 is a cross-sectional view of an assembled light emitting apparatus according to one embodiment.
Figure 2:
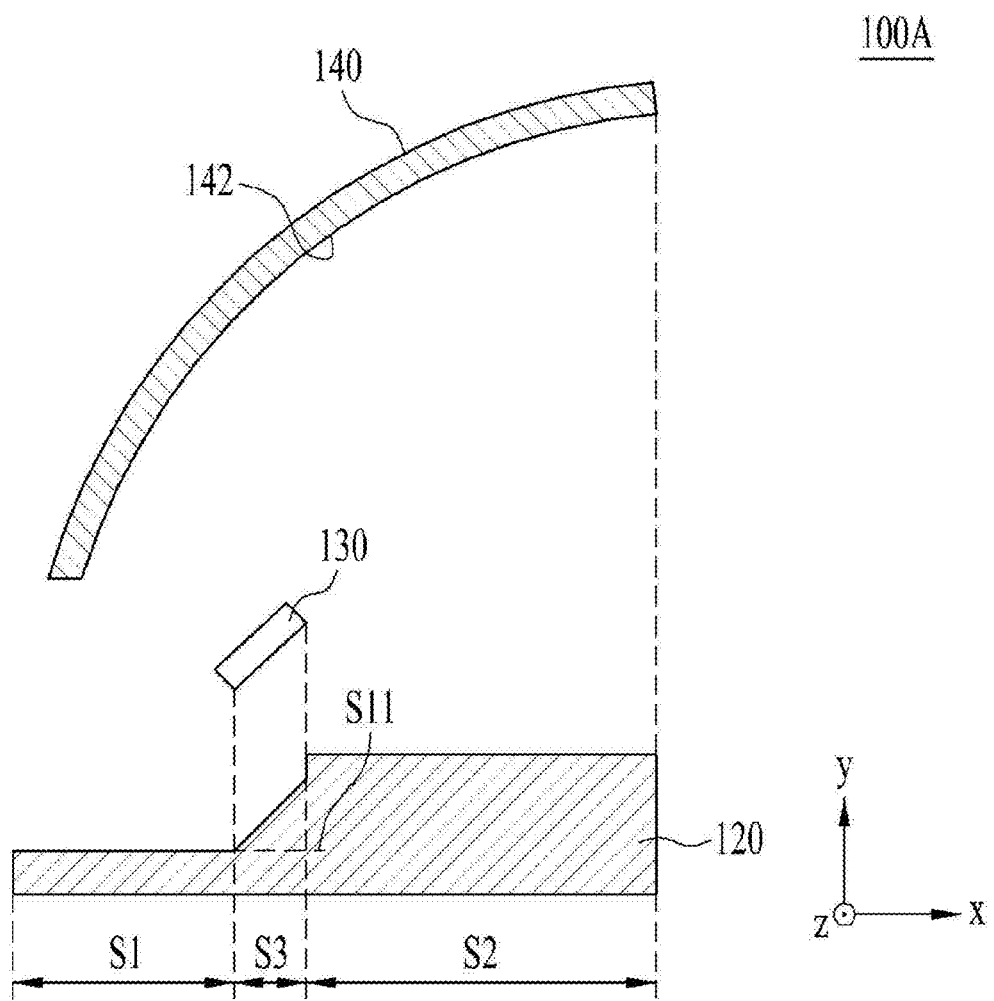
FIG. 2 is a cross-sectional view of the disassembled light emitting apparatus of FIG. 1.

FIG. 1 is a cross-sectional view of an assembled light emitting apparatus 100A according to one embodiment. FIG. 2 is a cross-sectional view of the disassembled light emitting apparatus 100A shown in FIG. 1 except a light source 110 and an optical portion 150.

Referring to FIGS. 1 and 2, the light emitting apparatus 100A according to one embodiment may include the light source 110, a substrate 120, a wavelength converter 130, a reflector 140, and the optical portion 150.

The light source 110 may emit light (hereinafter, referred to as excited light) and may include at least one of a light emitting diode (LED) or a laser diode (LD) but is not limited thereto.

Figure 6:
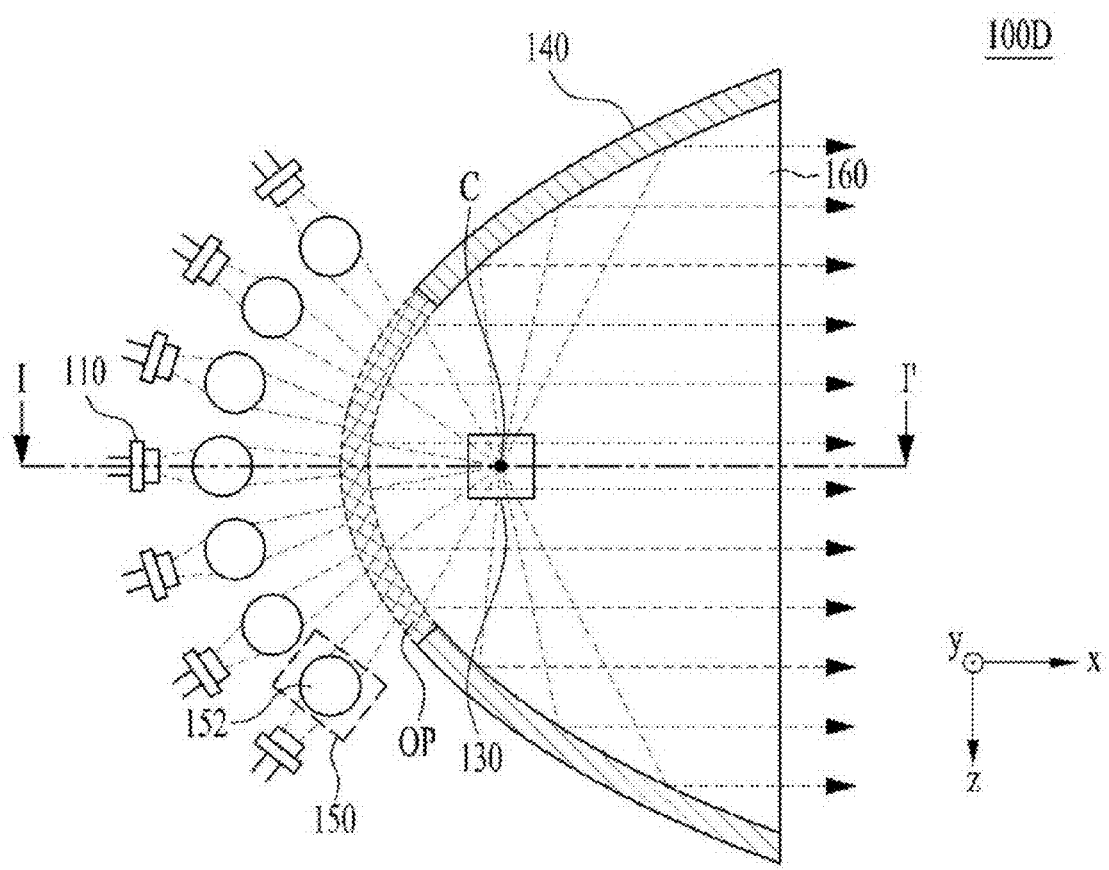
FIG. 6 is a top view of a light emitting apparatus according to still another embodiment.

In FIGS. 1 and 2, there is only one light source 110. However, the light source 110 is not limited in number. That is, as shown in FIG. 6, a plurality of such light sources 110 may be provided.

Also, the excited light emitted from the light source 110 may have a random peak wavelength within a range of a wavelength band from 400 nm to 500 nm but is not limited thereto. The light source 110 may emit the excited light having a spectral full width at half maximum (SFWHM) of 10 nm or less. This corresponds to a wavelength width of intensity for each wavelength. However, the light source 110 is not limited to a particular value of SFWHM. Also, a full width at half maximum (FWHM) of the excited light emitted from the light source 110 and incident on the wavelength converter 130, that is, a size of a beam may be 1 nm or less but is not limited thereto.

The optical portion 150 focuses and collimates the excited light emitted from the light source 110. For this, the optical portion 150 may be disposed on a path in which the excited light emitted from the light source 110 progresses toward the wavelength converter 130. The optical portion 150 may include at least one focal lens disposed between the light source 110 and the wavelength converter 130. For example, as shown in FIG. 1, the optical portion 150 may include one focal lens 152 but is not limited thereto. That is, according to other embodiments, the optical portion 150 may include a plurality of focal lenses. In this case, the plurality of focal lenses may be arranged in a row between the light source 110 and the wavelength converter 130.

The focal lens 152 included in the optical portion 150 may focus the excited light. As shown in FIG. 1, when light is incident on the wavelength converter 130 through an opening OP formed at a point most adjacent to the wavelength converter 130 and the reflector 140, a structure of the optical portion 150 may be simplified.

The optical portion 150 and the opening OP are spaced apart at a certain distance d in FIG. 1 but are not limited thereto. According to other embodiments, the optical portion 150 may be disposed while being inserted into the opening OP of the reflector 140. That is, the certain distance d may be "0".

The wavelength converter 130 may be disposed on the substrate 120. Referring to FIG. 2, the substrate 120 may include first and second horizontal surfaces S1 and S2 and an inclined surface S3. Here, the second horizontal surface S2 may be higher than the first horizontal surface S1, the inclined surface S3 is disposed between the first and second horizontal surfaces S1 and S2, and the wavelength converter 130 may be mounted. The wavelength converter 130 may be disposed on the inclined surface S3 of the substrate 120 to face the optical portion 150 through the opening OP.

An inclination angle θ of the inclined surface S3 may be greater than 0° and may be 70° or less but is not limited thereto. Here, the inclination angle θ will be defined as increasing counterclockwise based on a virtual horizontal surface S11 which extends from the first horizontal surface S1.

The wavelength converter 130 converts a wavelength of the excited light emitted from the light source 110 and emits converted light (hereinafter, referred to as conversion light) to the reflector 140. Here, the wavelength converter 130 may not convert wavelengths of all the excited light. That is, a part of the light reflected by the wavelength converter 130 may correspond to the conversion light with the converted wavelength and other parts of the light may be light with unconverted wavelengths.

Since the wavelength of the excited light emitted from the light source 110 is converted by the wavelength converter 130, white light or light at a desired color temperature may be emitted from the light emitting apparatus 100A. For this, the wavelength converter 130 may include a phosphor, for example, at least one of ceramic phosphor, lumiphors, or a YAG single-crystal. Here, lumiphors may indicate luminescent materials or a structure including luminescent materials.

Also, concentrations, particle-sizes, and size distributions of various materials included in the wavelength converter 130, a thickness of the wavelength converter 130, and surface roughness and bubbles of the wavelength converter 130 are controlled, thereby allowing the light at the desired color temperature to be emitted from the light emitting apparatus 100A. For example, the wavelength converter 130 may convert a wavelength band of light from 3000 K to 9000 K based on a color temperature. That is, a color temperature range of the conversion light converted in wavelength by the wavelength converter 130 may be from 3000 K to 9000 K but is not limited thereto.

The wavelength converter 130 may have various forms. For example, the wavelength converter 130 may have three forms such as a phosphor in glass (PIG) form, a polycrystalline form (or a ceramic form), and a single crystalline form.

The reflector 140 is disposed on the substrate 120 to be opposite to the wavelength converter 130 and reflects the light from the wavelength converter 130 to emit through a virtual light exit surface OS. For this, a reflecting surface 142 of the reflector 140 may be a parabolic surface, a spherical surface, or an ellipsoidal surface. For example, when the reflecting surface 142 is a parabolic surface, the parabolic surface may be shown as the following Equation 1.

$$y^2 = 4px \qquad \text{Equation (1)}$$

Here, x and y indicate coordinates of an x axis and a y axis shown in FIGS. 1 and 2 and p indicates a focal length F.

Also, the reflector 140 may include the opening OP. Here, the opening OP may be formed at a point where a distance between the reflecting surface 142 and the wavelength converter 130 is smallest and may have a shape which allows the light emitted from the light source 110 to progress toward the wavelength converter 130. The excited light incident through the opening OP may be received at a center C of the wavelength converter 130.

When the wavelength converter 130 may be disposed on the substrate 120 and the reflector 140 has a parabolic mirror shape as shown in FIGS. 1 and 2, the opening OP may be formed at a bottom of the reflector 140 as shown in FIGS. 1 and 2. However, when the point where the distance between the reflector 140 and the wavelength converter 130 is the smallest is not the bottom of the reflector 140 but a top thereof, the opening OP may be formed at the top.

The excited light which is emitted from the light source 110 and passes through the optical portion 150 may be incident through the opening OP in an x-axis direction which is horizontal.

The reflector 140, depending on a desired illumination distribution, may include at least one of an aspherical surface, a freeform curved surface, a Fresnel lens, or a holography optical element (HOE). Here, the freeform curved surface may refer to a shape with curved surfaces in various shapes.

When the Fresnel lens is used as the reflector 140, the Fresnel lens may perform as the reflector 140 which reflects not only the conversion light having the wavelength converted by the wavelength converter 130 but also light having an unconverted wavelength.

Figure 3:
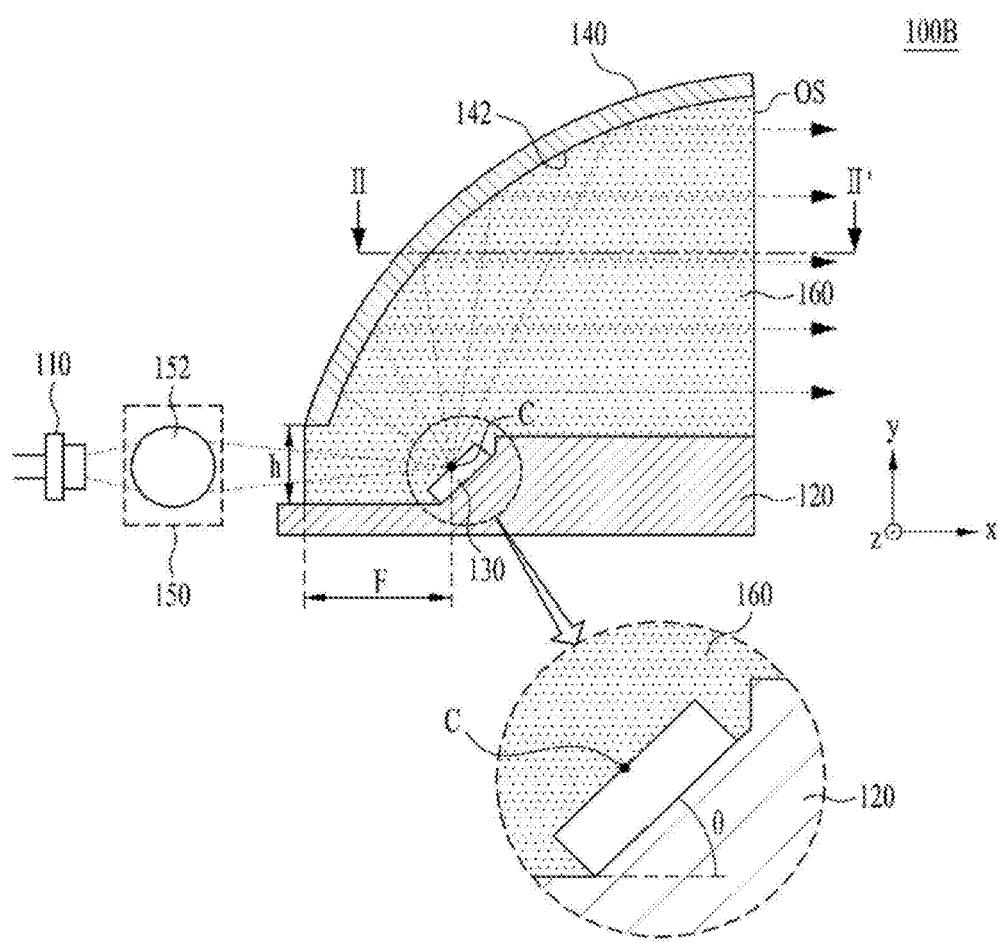
FIG. 3 is a cross-sectional view of an assembled light emitting apparatus according to another embodiment.
Figure 4:
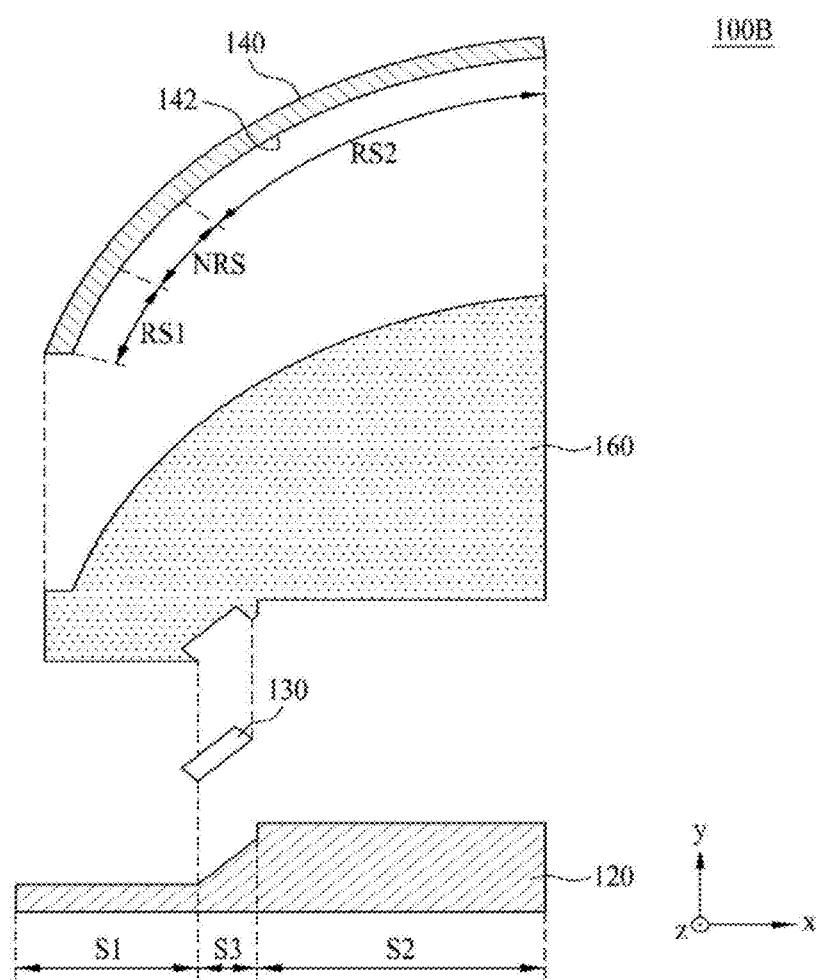
FIG. 4 is a cross-sectional view of the disassembled light emitting apparatus of FIG. 3.

FIG. 3 is a cross-sectional view of an assembled light emitting apparatus 100B according to another embodiment. FIG. 4 is a cross-sectional view of the disassembled light emitting apparatus 100B shown in FIG. 3 except a light source 110 and an optical portion 150.

Referring to FIGS. 3 and 4, the light emitting apparatus 100B may include the light source 110, the substrate 120, the wavelength converter 130, the reflector 140, the optical portion 150, and a refracting member 160.

Here, since the light source 110, the substrate 120, the wavelength converter 130, the reflector 140, and the optical portion 150 shown in FIGS. 3 and 4 correspond to the light source 110, the substrate 120, the wavelength converter 130, the reflector 140, and the optical portion 150 shown in FIGS. 1 and 2, respectively, like reference numerals designate like elements and repetitive description thereof will be omitted.

The refracting member 160 may be disposed between the reflector 140 and the wavelength converter 130 to fill a path through which light passes. When the light emitting apparatus 100A does not include the refracting member 160 as shown in FIGS. 1 and 2, loss of light converted in wavelength may consequently occur by a Fresnel equation while the light having a wavelength converted by the wavelength converter 130 progresses toward the reflector 140. The light loss occurs because a total internal reflection (TIR) angle is smaller due to a difference in refractive index between air present between the wavelength converter 130 and the reflecting surface 142 of the reflector 140 and the wavelength converter 130 in such a way that only the conversion light emitted from the wavelength converter 130 at a narrow angle can progress toward the reflecting surface 142. In addition, when the excited light having highly integrated properties such as an LD is used as the light source 110, the difference in refractive index between the wavelength converter 130 and the air becomes greater in such a way that the light loss may increase. When the LD is used, there is no appropriate material for the wavelength converter 130 except a single/poly-crystalline-form material having a high refractive index.

However, when the light emitting apparatus 100B includes the refracting member 160 as shown in FIGS. 3 and 4, the loss of the light converted in wavelength may be reduced while the conversion light is progressing from the wavelength converter 130 toward the reflector 140. As a difference in refractive index between a first refractive index n1 of the refracting member 160 and a second refractive index n2 of the wavelength converter 130 is smaller, a width of light extraction efficiency of the light emitting apparatus 100B may increase. That is because the conversion light converted in wavelength at the wavelength converter 130 may arrive at the reflecting surface 142 without loss.

A ratio n2/n1 of the second refractive index n2 of the wavelength converter 130 to the first refractive index n1 of the refracting member 160 may be 0.3 or less but is not limited thereto. When the ratio (n2/n1) is 0.3 or less as described above, the first and second refractive indexes n1 and n2 are matched and a phenomenon in which the light loss occurs due to the TIR in the wavelength converter 130 does not occur.

Considering the difference in refractive index described above, materials of the wavelength converter 130 and the refracting member 160 may be selected.

Depending on the form of the wavelength converter 130, the second refractive index n2 may differ. When the wavelength converter 130 is the PIG form, the second refractive index n2 may be in a range from 1.3 to 1.7. When the wavelength converter 130 is the polycrystalline form, the second refractive index n2 may be in a range from 1.5 to 2.0. When the wavelength converter 130 is the single crystalline form, the second refractive index n2 may be in a range from 1.5 to 2.0. As described above, the second refractive index n2 may be in a range from 1.3 to 2.0 but is not limited thereto. For example, the refracting member 160 may include at least one of an $Al_2O_3$ single crystal, $Al_2O_3$ glass, or $SiO_2$ glass. The first refractive index n1 of the refracting member 160 may be in a range from 1.4 to 1.8 but is not limited thereto.

Since the light reflected by the reflector 140 is emitted toward the air in a direction vertical to the light exit surface (or, boundary surface) OS, according to the light emitting apparatus 100B shown in FIGS. 3 and 4, the light loss scarcely occurs.

Also, the reflector 140 and the refracting member 160 may be integrally implemented. In this case, the refracting member 160 may perform as not only a lens but also a reflector. As described above, when the reflector 140 and the refracting member 160 are integrally implemented, the conversion light which progresses from the wavelength converter 130 to the reflector 140 may be more less likely to be in contact with air.

Also, the refracting member 160 and the substrate 120 may have at least one of a two-dimensional pattern or a three-dimensional pattern depending on the desired illumination distribution to be implemented by the light emitting apparatus 100B.

Meanwhile, when the excited light emitted from the light source 110 includes light in a blue wavelength band (hereinafter, referred to as "blue light"), due to a difference in refractive index between the wavelength converter 130 and the refracting member 160, at least a part of the blue light may not be converted in wavelength at the wavelength converter 130 and may be mirror-reflected according to a Fresnel equation. Here, an amount of the mirror-reflected blue light depends on the difference in refractive index between the refracting member 160 and the wavelength converter 130 and an angle of the blue light incident on the wavelength converter 130. When there is no difference in refractive index between the wavelength converter 130 and the refracting member 160, the blue light is not mirror-reflected by the wavelength converter 130. However, when there is the difference in refractive index between the refracting member 160 and the wavelength converter 130, the blue light may be mirror-reflected by the wavelength converter 130 without being converted in wavelength by the wavelength converter 130, may pass through the reflector 140 and the refracting member 160, and may exit through the light exit surface OS. When the mirror-reflected blue light exits through the light exit surface OS, a harmful effect may be given to a human body. To prevent this, the light emitting apparatus according to the embodiments may have various forms as described above.

Referring to FIG. 4, the reflector 140 may include reflecting surfaces RS1 and RS2 and a non-reflecting surface NRS. Here, the non-reflecting surface NRS is defined as a surface which includes a point at which the blue light reflected from the wavelength converter 130 arrives and the reflecting surfaces RS1 and RS2 are surfaces of the reflector 140 except the non-reflecting surface NRS and are defined as a surface at which the light converted in wavelength at the wavelength converter 130 is reflected. The reflecting surfaces RS1 and RS2 and the non-reflecting surface NRS may be included in an inner surface of the reflector 140 facing the wavelength converter 130. Here, according to the law of reflection, since the blue excited light is incident and reflected in such a way that an incidence angle and an exit angle thereof are identical based on a normal perpendicular to a surface of the wavelength converter 130, a point of the reflector 140, at which the blue light arrives, may be estimated.

According to one embodiment, the reflecting surfaces RS1 and RS2 may be metal-mirror-coated to reflect the light converted in wavelength at the wavelength converter 130. On the contrary, the non-reflecting surface NRS is not metal-mirror-coated to prevent the blue light which arrives at the non-reflecting surface NRS from being reflected, thereby preventing the blue light from exiting through the light exit surface OS.

According to other embodiments, the non-reflecting surface NRS may be surface-treated to scatter light. For this, the non-reflecting surface NRS may include, for example, roughness. As described above, when the blue light is scattered on the non-reflecting surface NRS, the blue light may not exit through the light exit surface OS.

Figure 5:
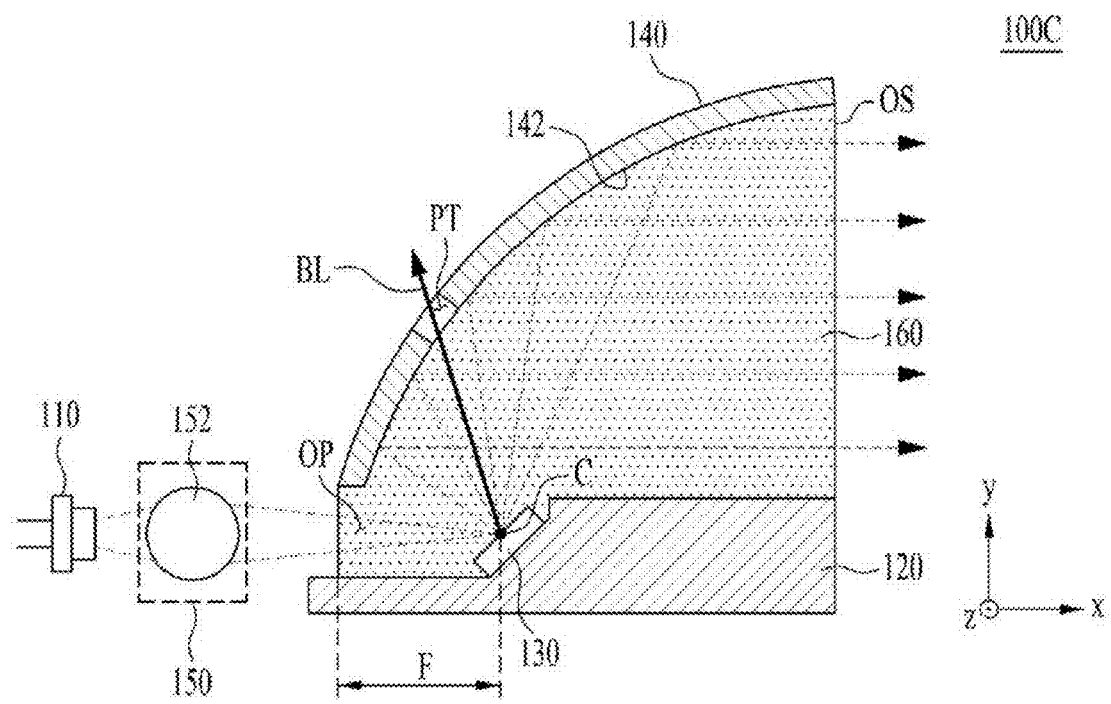
FIG. 5 is a cross-sectional view of a light emitting apparatus according to another embodiment.

FIG. 5 is a cross-sectional view of the light emitting apparatus 100C according to still another embodiment.

According to another embodiment, as described above, to prevent the blue light from exiting through the light exit surface OS, as shown in FIG. 5, the reflector 140 of the light emitting apparatus 100C may include a passing through hole PT. The passing through hole PT is formed to allow the blue light to pass through at a point at which the blue light mirror-reflected by the wavelength converter 130 arrives. Accordingly, the blue light mirror-reflected by the wavelength converter 130 may exit through the passing through hole PT and not the light exit surface OS.

As described above, except that the reflector 140 further includes the passing through hole PT, the light emitting apparatus 100C shown in FIG. 5 is identical to the light emitting apparatus 100B shown in FIG. 3. Accordingly, like reference numerals designate like elements and repetitive description thereof will be omitted. That is, the light sources 110, the substrates 120, the wavelength converters 130, the optical portions 150, and the refracting members 160 shown in FIGS. 3 to 5, respectively, are identical.

In the above embodiments, the number of the light source 110 is one in each of the light emitting apparatuses 100A to 100C but is not limited thereto. That is, a plurality of such light sources 110 may be present. When the light emitting apparatus 100A, 100B, or 100C may be used for lighting for a vehicle, the plurality of light sources 110 may be provided. As described above, depending on the field of applying the light emitting apparatuses according to the embodiments, the number of the light sources 110 may differ.

Hereinafter, the light emitting apparatus 100D which includes a plurality of light sources according to another embodiment will be described as follows.

FIG. 6 is a top view of the light emitting apparatus 100D according to still another embodiment.

In FIG. 6, seven light sources 110 are shown. However, the following description may be applied even when the number of the light sources 110 is smaller or greater than seven. Also, seven optical portions 150 included in the light emitting apparatus 100D according to the embodiment are shown but the number thereof is not limited thereto. That is, even when the number of the optical portions 150 is greater or smaller than seven, the following description may be applied. Also, one optical portion 150 is allocated to one light source 110 but is not limited thereto. That is, a single optical portion 150 may be allocated to the plurality of light sources 110 or the plurality of optical portions 150 may be allocated to the one light source 110.

Except that the plurality of light sources 110 are present, since a cross-sectional view of the light emitting apparatus 100D shown in FIG. 6 is identical to that of the light emitting apparatus 100B shown in FIG. 3, the cross-sectional view of the light emitting apparatus 100D shown in FIG. 6 it will be omitted. That is, FIG. 3 is a cross-sectional view taken along a line I-I' shown in FIG. 6 in a view from a −z-axis direction. Also, except that the plurality of light sources 110 are present, FIG. 6 corresponds to a top view taken along a line II-II' shown in FIG. 3 in a view from a −y-axis direction. Accordingly, the wavelength converter 130, the reflector 140, and the refracting member 160 shown in FIG. 6 and the wavelength converter 130, the reflector 140, and the refracting member 160 shown in FIG. 3 perform the same functions, respectively.

Referring to FIG. 6, the opening OP of the reflector 140 may be formed larger than the opening OP shown in FIG. 3 to receive the excited light emitted from the plurality of light sources 110 and the plurality of optical portions 150. That is, on a plane formed by an x axis and a y axis, a width of the opening OP may be greater than when there is only one light source 110 present.

Also, the plurality of light sources 110 may be disposed at the same distance from a center C of the wavelength converter 130 while being spaced apart but are not limited thereto. According to another embodiment, the light sources 110 may be disposed at different distances from the center C of the wavelength converter 130 while being spaced apart. For example, as the light source 110 has a larger light amount, the light source 110 may be disposed closer to the center C of the wavelength converter 130.

Also, the plurality of light sources 110, as shown in FIG. 6, may be arranged in a fan shape (or, a rotationally symmetric plane shape based on the center C of the wavelength converter 130) but are not limited thereto. According to another embodiment, the plurality of light sources 110 may be arranged in various plane shapes.

Hereinafter, features of the light emitting apparatuses 100A to 100D having the configurations described above according to embodiments will be described with reference to the attached drawings as follows.

Figure 7:
FIG. 7 is a graph illustrating strength according to height of an opening.

FIG. 7 is a graph illustrating strength for height h of the opening OP, in which a horizontal axis indicates the height h and a vertical axis indicates strength.

When the wavelength converter 130 is disposed on the substrate 120, a point where the wavelength converter 130 is nearest to the reflector 140 may correspond to the bottom of the reflector 140. In this case, as shown in FIGS. 1 to 6, the opening OP may be formed at the bottom of the reflector 140.

Referring to FIG. 7, as the height h of the opening OP increases, the strength of light becomes reduced. That is, when the height h is "0", the strength is highest. As the height h increases, the strength becomes gradually reduced. Accordingly, the height h of the opening OP may be determined as a smallest possible value, which allows the excited light to be incident on the wavelength converter 130. For example, when the first refractive index n1 of the refracting member 160 is 1.8 and the excited light is incident in an x-axis direction through the opening OP, the height h of the opening OP may be greater than 0 and 20 mm or less but is not limited thereto. Here, referring to FIG. 7, the strength may be lost because the height h is not "0". However, considering improvements in the entire efficiency, performance, and reliability of the light emitting apparatuses 100A to 100D, the loss may be fully compensated.

Figure 8:
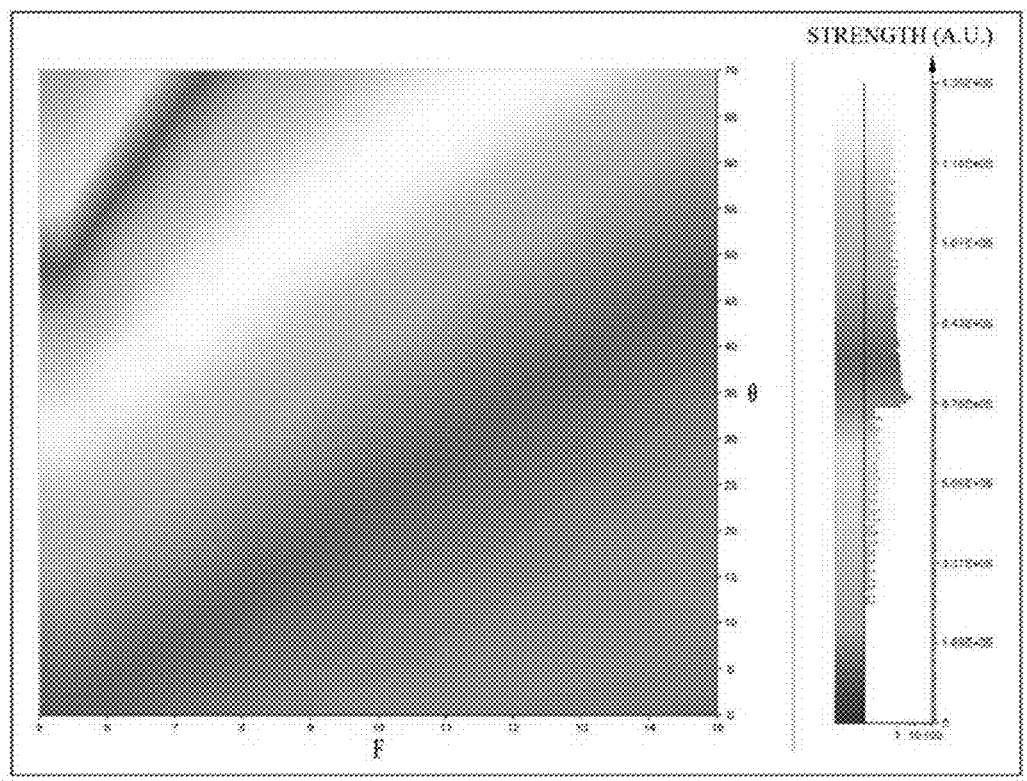
FIG. 8 is a graph illustrating a relationship between strength of intensity according to a focal distance and an inclination angle.

FIG. 8 is a graph illustrating a relationship between strength of intensity according to the focal distance F and inclination angle θ. Here, the strength indicates a relative value not an absolute value.

First, optimal focal distance F and inclination angle θ may be determined for each height h of the opening OP. When the height h is 10 mm, the first refractive index n1 of the refracting member 160 is 1.8, and the excited light is incident through the opening OP in the x-axis direction, referring to FIG. 8, the focal length F between the opening OP and the center C of the wavelength converter 130 may be in a range from 6 mm to 70 mm and the inclination angle θ may be in a range from 30° to 70° but are not limited thereto.

When an optical path of the excited light transferred to the wavelength converter 130 becomes longer, a structure of the optical portion 150 may become complicated. In this case, the optical portion 150 may include a mirror, a prism, and various lenses including an Fθ lens which focuses a large number of focuses into one focus. However, in the case of the light emitting apparatuses 100A to 100D according to the above embodiments, since the excited light may be transferred along the shortest route to the wavelength converter 130 through the opening OP, the number of components which form the optical portion 150 is smaller than existing light emitting apparatuses, a structure thereof is simple to be reduced in size and weight, manufacturing costs can be reduced, and productivity and reliability can be improved.

Also, when the structure of the optical portion 150 is complicated or the number of components which form the optical portion 150 is large, stability in arranging or fixing the components may decrease. On the contrary, the optical portion 150 of the light emitting apparatuses 100A to 100D according to the embodiments has a small number of components as described above, thereby providing mechanical stability. That is, as described above, the optical portion 150 may include one or two lenses.

Also, to convert the wavelength of the excited light, the light emitting apparatuses 100A to 100D according to the above embodiments does not employ a transmission type to allow the excited light to be transmitted by the wavelength converter 130 but employs a reflection type to allow the excited light to be reflected by the wavelength converter 130. As described above, when the wavelength converter 130 converts the wavelength through reflection, due to the property of the wavelength converter 130 in which the conversion light emitted from both sides of the wavelength converter 130 are collected in one direction, optical conversion efficiency can be more increased than that of the transmission type.

Also, the light emitting apparatuses 100A to 100D according to the embodiments can be applied to various fields. For example, the light emitting apparatuses 100A to 100D may be applied to broad fields such as various lamps of a vehicle, for example, a low beam, a high beam, a taillight, a sidelight, a turn signal, a daytime running light (DRL), a fog lamp, etc., a flashlight, traffic lights, and various lighting devices.

The light emitting apparatuses according to the embodiments have a small number of components which form an optical portion and a simple structure in comparison with the existing light emitting apparatus, thereby being reduced in size and weight and manufactured at a low price, improving productivity and reliability, and providing mechanical stability. Also, the light emitting apparatuses employ the reflection type, thereby providing higher optical conversion efficiency than that of the transmission type.

It should be understood that the exemplary embodiments described therein should be considered in a descriptive sense only and not for purposes of limitation. It will be understood by those of ordinary skill in the art that various changes in form and details may be made therein without departing from the spirit and scope of the embodiments. For example, respective components shown in detail in the embodiments may be modified to implement. Also, it will be understood that differences related to the modification and application are included in the scope of the present invention as defined by the following claims.

What is claimed is:

1. A light emitting apparatus, comprising:
   a substrate;
   at least one light source;
   a wavelength converter disposed on the substrate to convert a wavelength of light emitted from the at least one light source; and
   a reflector which comprises an opening formed at a point nearest to the wavelength converter to allow the light emitted from the at least one light source to progress toward the wavelength converter, the reflector being disposed on the substrate to reflect light from the wavelength converter,
   wherein the reflector comprises a passing through hole formed at a point at which blue light reflected by the wavelength converter arrives to allow the blue light to pass through.

2. The light emitting apparatus of claim 1, further comprising a refracting member disposed between the reflector and the wavelength converter to fill a path through which the light passes.

3. The light emitting apparatus of claim 2, wherein a ratio of a second refractive index of the wavelength converter to a first refractive index of the refracting member is 0.3 or less.

4. The light emitting apparatus of claim 1, further comprising an optical portion disposed on a path through which the light emitted from the at least one light source progresses toward the wavelength converter.

5. The light emitting apparatus of claim 4, wherein the optical portion comprises at least one focal lens disposed between the at least one light source and the wavelength converter.

6. The light emitting apparatus of claim 4, wherein the optical portion is disposed to be inserted into the opening of the reflector.

7. The light emitting apparatus of claim 1, wherein the substrate comprises:
   a first horizontal surface;
   a second horizontal surface higher than the first horizontal surface; and
   an inclined surface disposed between the first and second horizontal surfaces, on which the wavelength converter is mounted.

8. The light emitting apparatus of claim 7, wherein an inclination angle of the inclined surface is greater than 0° and is 70° or less.

9. The light emitting apparatus of claim 1, wherein the opening is formed at a bottom of the reflector.

10. The light emitting apparatus of claim 9, wherein a height of the opening is greater than 0 mm and is 20 mm or less.

11. The light emitting apparatus of claim 9, wherein a focal length between the opening and the wavelength converter is in a range from 6 mm to 70 mm.

12. The light emitting apparatus of claim 1, wherein the at least one light source comprises a plurality of light sources, and
   wherein the plurality of light sources are disposed at the same distance from a center of the wavelength converter while being spaced apart.

13. The light emitting apparatus of claim 12, wherein the plurality of light sources are arranged in a fan shape.

14. The light emitting apparatus of claim 1, wherein the at least one light source comprises a plurality of light sources, and
   wherein the plurality of light sources are disposed at different distances from a center of the wavelength converter while being spaced apart.

15. The light emitting apparatus of claim 14, wherein among the plurality of light sources, the light source which has a relatively larger light amount is disposed closer to the center than the light source which has a relatively smaller light amount.

16. A light emitting apparatus, comprising:
   a substrate;
   at least one light source;
   a wavelength converter disposed on the substrate to convert a wavelength of light emitted from the at least one light source; and
   a reflector that comprises an opening formed at a point nearest to the wavelength converter to allow the light emitted from the at least one light source to progress toward the wavelength converter, the reflector being disposed on the substrate to reflect light from the wavelength converter,
   wherein the reflector comprises:
   a reflecting surface which reflects light converted in wavelength at the wavelength converter; and
   a non-reflecting surface formed at a point at which blue light reflected by the wavelength converter arrives.

17. The light emitting apparatus of claim 16, wherein the reflecting surface is metal-mirror-coated and the non-reflecting surface is not metal-mirror-coated.

18. The light emitting apparatus of claim 16, wherein the non-reflecting surface is surface-treated to scatter light.

19. The light emitting apparatus of claim 18, wherein the non-reflecting surface has roughness.

20. The light emitting apparatus of claim 16, further comprising a refracting member disposed between the reflector and the wavelength converter to fill a path through which the light passes.

* * * * *